United States Patent
Kakinuma et al.

(10) Patent No.: US 6,858,886 B2
(45) Date of Patent: Feb. 22, 2005

(54) OPTICAL SEMICONDUCTOR DEVICE AND METHOD OF FABRICATING THE SAME

(75) Inventors: Hiroaki Kakinuma, Tokyo (JP); Mikio Mohri, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 54 days.

(21) Appl. No.: 10/411,216

(22) Filed: Apr. 11, 2003

(65) Prior Publication Data

US 2003/0197172 A1 Oct. 23, 2003

(30) Foreign Application Priority Data

Apr. 18, 2002 (JP) ........................................ 2002-116394

(51) Int. Cl.[7] ......................................... H01L 31/0328
(52) U.S. Cl. ..................... 257/186; 257/187; 257/189
(58) Field of Search ........................... 257/83, 186–189; 438/48

(56) References Cited

U.S. PATENT DOCUMENTS

| 5,014,096 A | * | 5/1991 | Matsuda et al. | 257/83 |
| 5,212,395 A | * | 5/1993 | Berger et al. | 257/185 |
| 5,399,885 A | * | 3/1995 | Thijs et al. | 257/95 |
| 6,501,104 B2 | * | 12/2002 | Inomoto | 257/186 |

* cited by examiner

Primary Examiner—David S. Blum
(74) Attorney, Agent, or Firm—Wenderoth, Lind & Ponack, L.L.P.

(57) ABSTRACT

A photodiode (111) and resistors (121) are formed on a semi-insulating InP substrate (101). The photodiode (111) is formed by subjecting a layered structure formed by successively depositing an $n^+$-type InP cladding layer (102), an n-type InGaAsP core layer (103), a nondoped InGaAs active layer (104), a p-type InGaAsP core layer (105), and a $p^+$-type InP cladding layer 106 on the InP substrate (101) to a selective etching process. The resistors (121) have the same layered structure as the photodiode (111). Photodiode (111) is connected to n-type wiring lines (131) and a p-type wiring line (141). Resistors (121) are connected to the n-type wiring lines (131) and the p-type wiring line (141) in parallel to the photodiode (111). A side surface on the side of the photodiode (111) of the InP substrate (101) is a cleavage plane, and the cleavage plane is coated with an antireflection film (161). Since the resistors (121) have a p-type semiconductor layer having a high resistivity, the resistors (121) can be formed in a big width. Consequently, change of resistance corresponding to change of the width of the resistor is small and hence matching can be easily achieved.

15 Claims, 6 Drawing Sheets

OPTICAL SEMICONDUCTOR DEVICE AND METHOD OF FABRICATING THE SAME

BACKGROUND OF THE INVENTION

1. Field of the Invention

The present invention relates to an optical semiconductor device provided with a load resistance for matching, and a method of fabricating the same.

2. Description of the Related Art

Active research and development activities have been made to use high modulation frequencies of 10 GHz or above for the rapid transmission of large quantity of information. Optical communication uses photodiodes, i.e., photoelectric converters. A photodiode receives light signals traveled through an optical fiber and converts the same into corresponding electric signals. An electronic circuit processes the electric signals and converts the same into characters, images or sounds.

The impedance of the electronic circuit with respect to the photodiode, and the impedance of the photodiode with respect to the electronic circuit must be accurately matched. A resistor is used for matching the impedances. Conventional impedance matching uses a resistor of an alloy having a comparatively high resistivity, such as NiCr, or an n-type semiconductor having a high impurity concentration.

Impedance matching must be performed in an accuracy higher than that in which conventional impedance matching is performed, when light signals of high frequencies higher than a microwave band for frequencies on the order of several gigahertz. To achieve impedance matching in such a high accuracy, the resistor must be formed so that its resistance coincides accurately with a design resistance, and hence the resistor must be formed in a comparatively big width.

The resistivities of NiCr and n-type semiconductors conventionally used for forming resistors are not very high. Since the resistance of a resistor is proportional to the resistivity of the material forming the resistor and inversely proportional to the width of the resistor, the resistor must be formed in a small width of several micrometers. However, the resistance of a resistor having a small width changes greatly when the width changes slightly, which makes matching difficult. Reduction of the width of a resistor increases the inductance of the resistor, which affects adversely to matching.

Accordingly, it is an object of the present invention to provide an optical semiconductor device capable of solving the foregoing problems, and a method of easily fabricating such an optical semiconductor device.

SUMMARY OF THE INVENTION

An optical semiconductor device according to the present invention includes: a photodiode formed by successively depositing a first-conduction-type layer, an active layer and a second-conduction-type layer in that order; a resistor having a p-type semiconductor layer; first wiring lines; and a second wiring line. The first wiring lines are electrically connected to the first-conduction-type layer, the second wiring line is electrically connected to the second-conduction-type layer, and the first-conduction-type and the second-conduction-type layer are connected electrically by the p-type semiconductor layer.

DESCRIPTION OF THE PREFERRED EMBODIMENTS

First Embodiment

Figure 1A:
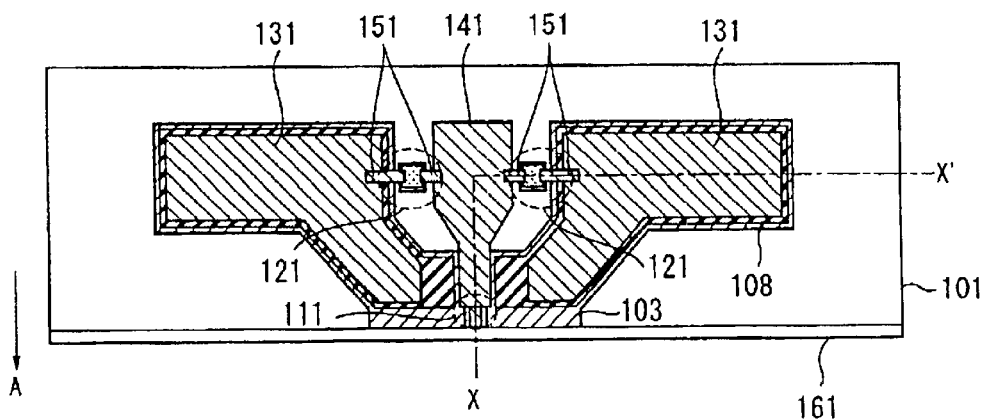
FIGS. 1(A) and 1(B) are a top view and a sectional view, respectively, of an optical semiconductor device in a first embodiment according to the present invention.
Figure 1B:
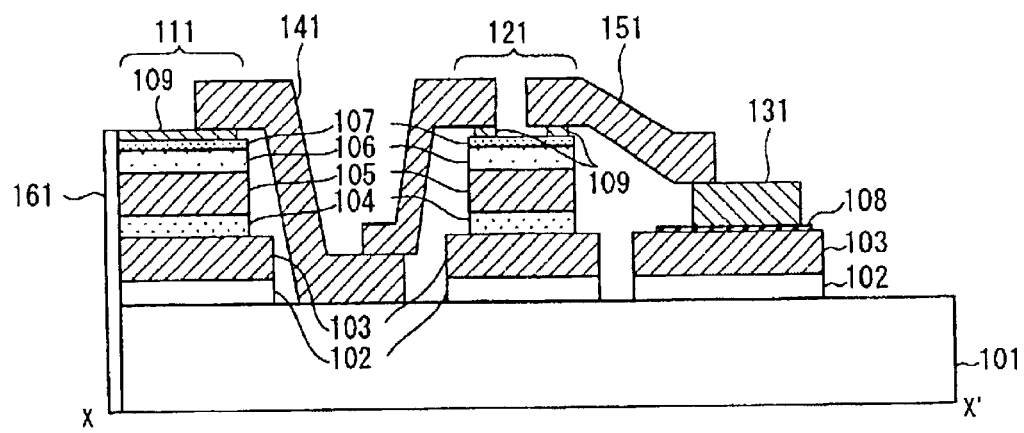

FIG. 1(A) is a top view of an optical semiconductor device in a first embodiment according to the present invention, and FIG. 1(B) is a sectional view taken on line x-X' in FIG. 1. In FIG. 1(A) the arrow A indicates a forward direction. The first embodiment of the present invention will be described with reference to FIGS. 1(A) and 1(B).

The optical semiconductor device in the first embodiment is constructed on a semi-insulating InP substrate 101, and includes a photodiode 111, two resistors 121, n-type wiring lines 131, and a p-type wiring line 141. The front surface of the InP substrate 101 is a cleavage plane, and is coated with an antireflection film 161 of SiN.

The photodiode 111 consists roughly of an upper part and a lower part. The lower part of the photodiode 111 is constructed on the semi-insulating InP substrate 101 and includes a 1.0 µm thick n$^+$-type InP cladding layer 102, and a 0.8 µm thick n-type InGaAsP core layer 103 formed on the n$^+$-type InP cladding layer 102. These layers 102 and 103 are first-conduction-type semiconductor layers. The upper part of the photodiode 111 is formed on the lower part of the photodiode 111. The upper part of the photodiode includes a 0.6 µm thick nondoped InGaAs active layer 104, a 0.8 µm thick p-type InGaAsP core layer 105, a 0.4 µm thick p$^+$-type InP cladding layer 106, and a 0.2 µm thick p$^{++}$-type In$_{0.53}$Ga$_{0.47}$As contact layer 107 deposited successively in that order. The layers of the upper part of the photodiode 111 other than the nondoped InGaAs active layer 104 correspond to the second-conduction-type semiconductor layers. The lower part of the photodiode 111 is formed in a shape shown in FIG. 1 by etching, and extends toward the back of the InP substrate 101.

The n-type wiring lines 131 corresponding to the first wiring line are metal foils. The n-type wiring lines 131 are formed on a first contact metal layer 108 formed on the lower part of the photodiode 111. The n-type wiring lines 131 extend together with the lower part of the photodiode 111 toward the back of the InP substrate 101.

The p-type wiring line 141 corresponding to the second wiring line is a metal foil. As shown in FIG. 1, the p-type wiring line 141 lies between the n-type wiring lines 131 and extends toward the back of the InP substrate 101. In other words, the n-type wiring lines 131 are disposed axisymmetrically with respect to the p-type wiring line 141. One end of each n-type wiring line 131 is connected to the p$^{++}$-type In$_{0.53}$Ga$_{0.47}$As contact layer 107, i.e., the top layer of the photodiode 111, by a second contact metal layer 109.

The resistors 121 are disposed as shown in FIG. 1(A). The resistors 121 are disposed axisymmetrically with respect to the p-type wiring line 141 as shown in FIG. 1(A). Each resistor 121 is formed by successively depositing a 1.0 µm thick n$^+$-type InP cladding layer 102, a 0.8 µm thick n-type InGaAsP core layer 103, a 0.6 µm thick nondoped InGaAs active layer 104, a 0.8 µm thick n-type InGaAsP core layer 105, a 0.4 µm thick p$^+$-type InP cladding layer 106, and a 0.2 µm thick p$^{++}$-type In$_{0.53}$Ga$_{0.47}$As contact layer 107 in that order. Thus, the resistor 121 is a layered structure similar to the photodiode 111. Although the resistors 121 are disposed on the opposite sides of the p-type wiring line 141, respectively, in FIG. 1(A), matching can be more easily achieved when the resistors 121 are disposed on one side of the p-type wiring line 141 and are connected in series because the resistors can be formed in a big width.

The n-type wiring lines 131 and the p-type wiring line 141 are electrically connected through the p$^{++}$-type In$_{0.53}$Ga$_{0.47}$As contact layer 107, i.e., the top layers of the resistors 121, by air bridges 151 formed from a metal foil. As shown in FIG. 1(B), the n-type wiring lines 131 and the p-type wiring line 141 are connected through the second contact metal layers 109.

Suppose that a dimension measured in the direction from the resistor 121 toward the n-type wiring lines 131 and the p-type wiring lines 141 is called 'length', a dimension measured along a direction perpendicular to the InP substrate 101 is called 'thickness', and a dimension measured in a direction perpendicular to 'length' and 'thickness' is called 'width'. Then, it is desirable that the air bridge is 5 µm or above in width, and 1 µm or above in thickness to have a sufficient strength. The n-type wiring line 131 is connected to the resistor 121 by the single air bridge 151, and the p-type wiring line 141 is connected to the air bridge by the single air bridge 151 in the optical semiconductor device shown in FIG. 1. When the n-type wiring line 131 is connected to the resistor 121 by a plurality of air bridges 151, and the p-type wiring line 141 are connected to the air bridge by a plurality of air bridges 151, the n-type wiring line 131 is not electrically disconnected from the resistor 121 even if one of the air bridges 151 is broken, and the p-type wiring line 141 is not electrically disconnected from the resistor 121 even if one of the air bridges 151 is broken, which enhances the reliability of the optical semiconductor device. The possibility of breakage of the air bridges 151 can be reduced when the air bridges 151 are formed in a length twice the height of the resistor 121 from the InP substrate 101 or greater.

The n-type wiring lines and the resistors are disposed axisymmetrically with respect to the p-type wiring line to transmit electric signals efficiently through the n-type wiring lines and the p-type wiring line.

The n-type wiring lines 131 and the p-type wiring line 141, which are formed from the metal foils, are connected to the semiconductor layers by the contact metal layers to reduce the resistance of the joints of the metal foils and the semiconductor layers. A preferable contact metal layer used in the first embodiment for connecting the metal foils and the n-type semiconductor layers is a layered structure formed by successively depositing an AuGe layer, an Ni layer and an Au layer. A contact layer for connecting the metal foils and the p-type semiconductor layers may be a layered structure formed by successively depositing a Ti layer, a Pt layer and an Au layer or a layered structure formed by successively depositing an AuZn layer and an Au layer.

The resistor of the first embodiment is provided with the p-type semiconductor layer having a high resistivity and hence the wiring lines do not need to be formed in a small width. Consequently, the change of the resistance due to the change of the width of the resistor can be reduced and hence matching can be easily achieved.

Second Embodiment

FIGS. 2(A) to 6(A) are top views and FIGS. 2(B) to 6(B) are sectional views taken on line X–X' in FIGS. 2(A) to 6(A), respectively, of assistance in explaining an optical semiconductor device fabricating method in a second embodiment according to the present invention. The arrow A in FIG. 2(A) indicates a forward direction. The optical semiconductor device in the first embodiment is fabricated by the optical semiconductor device fabricating method in the second embodiment.

Figure 2A:
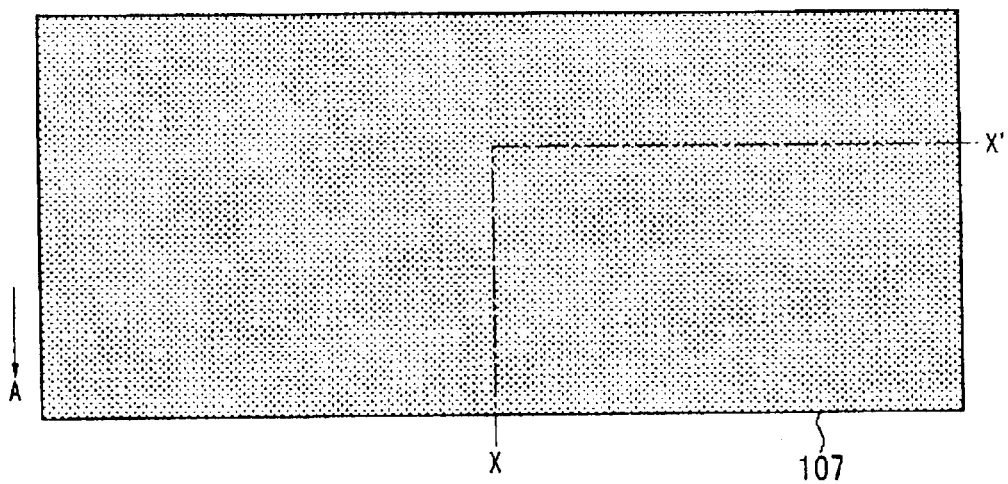
FIGS. 2(A) and 2(B) are a top view and a sectional view, respectively, of a workpiece of assistance in explaining an optical semiconductor device fabricating method in a second embodiment according to the present invention.
Figure 2B:
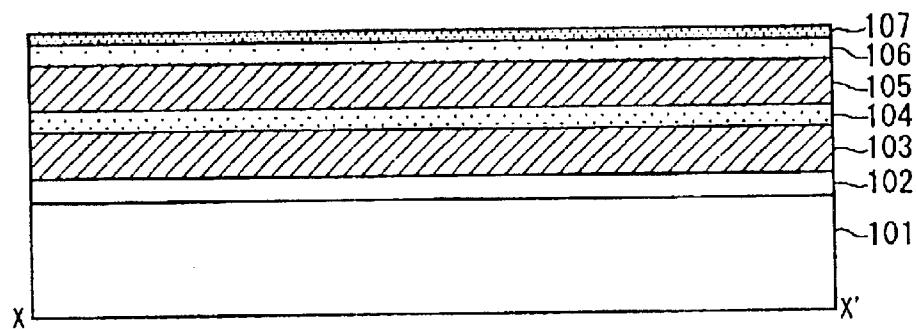

Referring to FIGS. 2(A) and 2(B), a 1.0 µm thick n$^+$-type InP cladding layer 102, a 0.8 µm thick n-type InGaAsP core layer 103, a 0.6 µm thick nondoped InGaAs active layer 104, a 0.8 µm thick p-type InGaAsP core layer 105, a 0.4 µm thick p$^+$-type InP cladding layer 106, and a 0.2 µm thick p$^{++}$-type In$_{0.53}$Ga$_{0.47}$As contact layer 107 are deposited successively in that order on a semi-insulating InP substrate 101 by metal-organic chemical vapor deposition processes or molecular-beam epitaxial processes to form a pin structure. The n$^+$-type InP cladding layer 102 and the n-type InGaAsP core layer 103 are n-type layers. The p-type InGaAsP core layer 105, the p$^+$-type InP cladding layer 106, and the p$^{++}$-type In$_{0.53}$Ga$_{0.47}$As contact layer 107 are p-type layers.

Figure 3A:
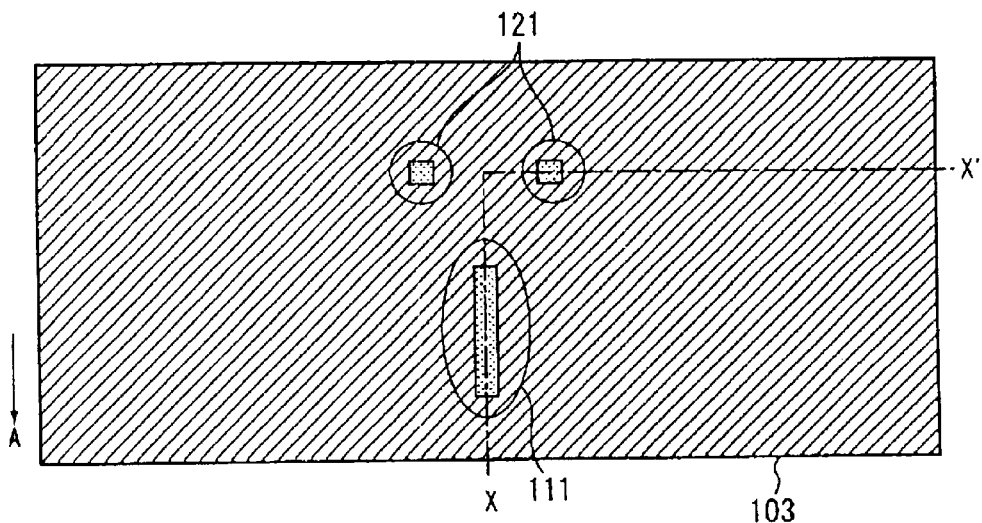
FIGS. 3(A) and 3(B) are a top view and a sectional view, respectively, of the workpiece of assistance in explaining an optical semiconductor device fabricating method in a second embodiment according to the present invention.
Figure 3B:
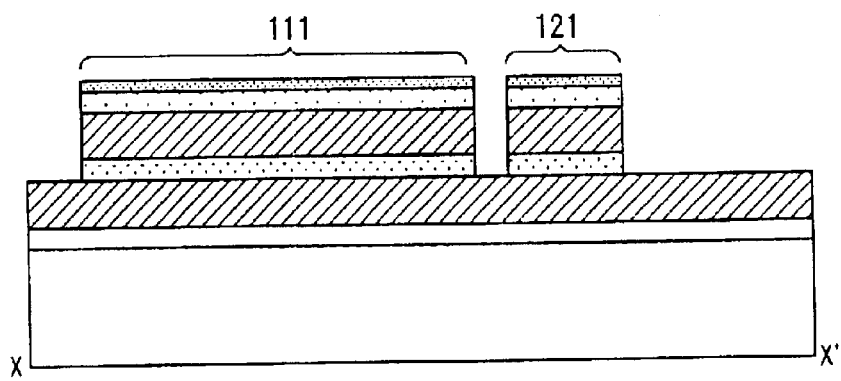

Referring to FIGS. 3(A) and 3(B), parts of the nondoped InGaAs active layer 104, the p-type InGaAsP core layer 105, the p$^+$-type InP cladding layer 106, and the p$^{++}$-type In$_{0.53}$Ga$_{0.47}$As contact layer 107 are removed selectively by a dry etching process using a gas containing Cl$_2$ to expose portions of the n-type InGaAsP core layer 103. Thus, an upper part of a photodiode 111, and an upper parts of resistors 121 are formed. As shown in FIG. 3(A), the upper part of the photodiode 111 is formed on a front middle part of the InP substrate 101, and the upper parts of the two resistors 121 are formed in a lateral arrangement behind the upper part of the photodiode 111.

Figure 4A:
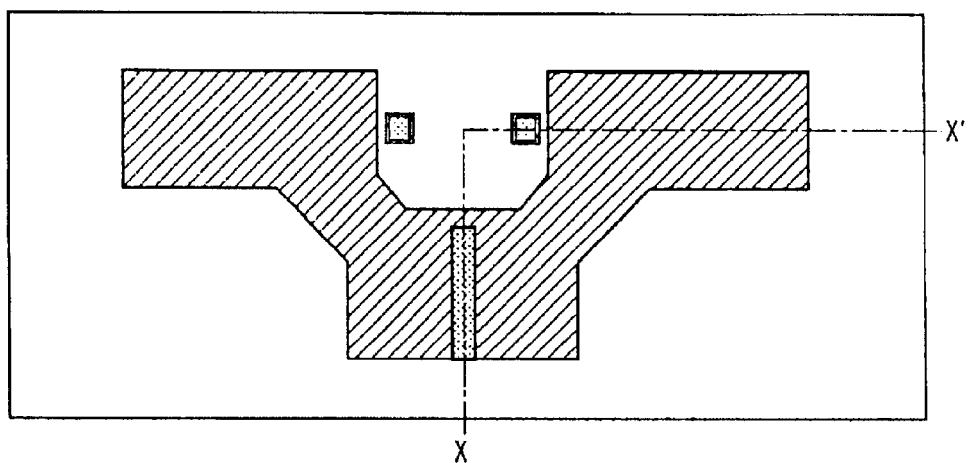
FIGS. 4(A) and 4(B) are a top view and a sectional view, respectively, of the workpiece of assistance in explaining an optical semiconductor device fabricating method in a second embodiment according to the present invention.
Figure 4B:
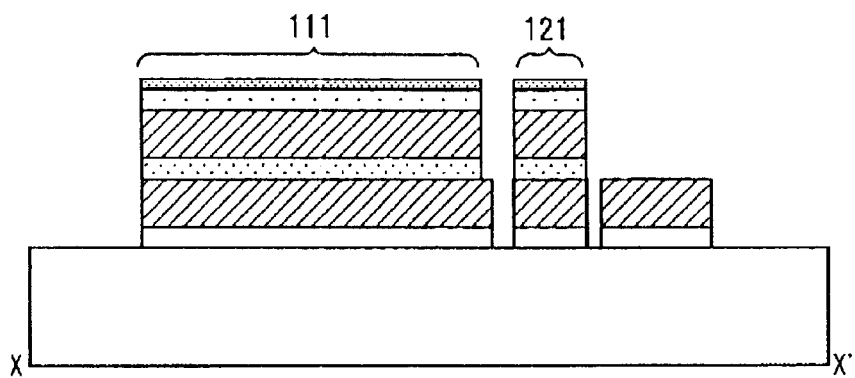

Referring to FIGS. 4(A) and 4(B), parts of the n$^+$-type InP cladding layer 102 and the n-type InGaAsP core layer 103 are removed selectively by a wet etching process using an etchant containing HCl and H$_3$PO$_4$, and an etchant containing H$_2$O$_2$ and H$_2$SO$_4$ to expose parts of the InP substrate 101. Thus a lower part of the photodiode 111, and lower parts of the resistors 121 are formed. The n$^+$-type InP cladding layer 102 and the n-type InGaAsP core layer 103 are etched in shapes as shown in FIG. 4(A), respectively, such that the previously formed upper part of the photodiode 111 overlies the lower part of the same.

Figure 5A:
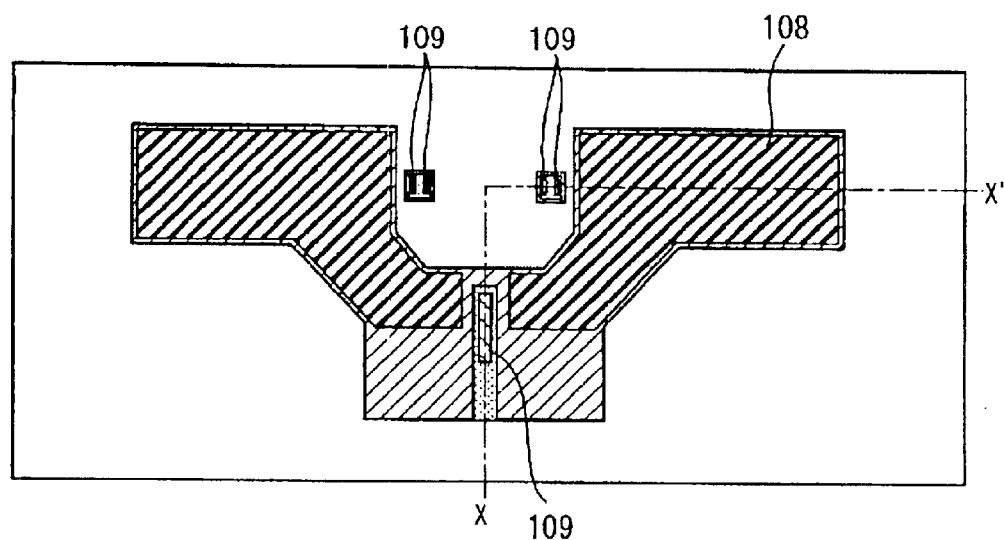
FIGS. 5(A) and 5(B) are a top view and a sectional view, respectively, of the workpiece of assistance in explaining an optical semiconductor device fabricating method in a second embodiment according to the present invention.
Figure 5B:
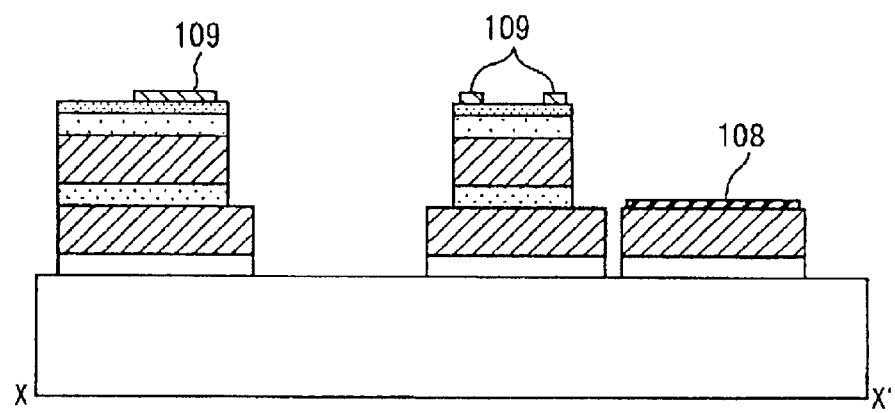

Referring to FIGS. 5(A) and 5(B), a first contact metal layer 108 is deposited over the lower part of the photodiode 111. A second contact metal layer 109 is deposited over the p$^{++}$-type In$_{0.53}$Ga$_{0.47}$As contact layer 107. The first contact metal layer 108 deposited on the n-type InGaAsP core layer 103 is formed by successively depositing an AuGe layer, an Ni layer and an Au layer. The second contact metal layer 109 deposited over the p$^{++}$-type In$_{0.53}$Ga$_{0.47}$As contact layer 107 is formed by successively depositing a Ti layer, a Pt layer and an Au layer, or by successively depositing an AuZn layer and an Au layer. As shown in FIG. 5(A), the second contact metal layer 109 is formed so as to cover also the resistors 121.

Figure 6A:
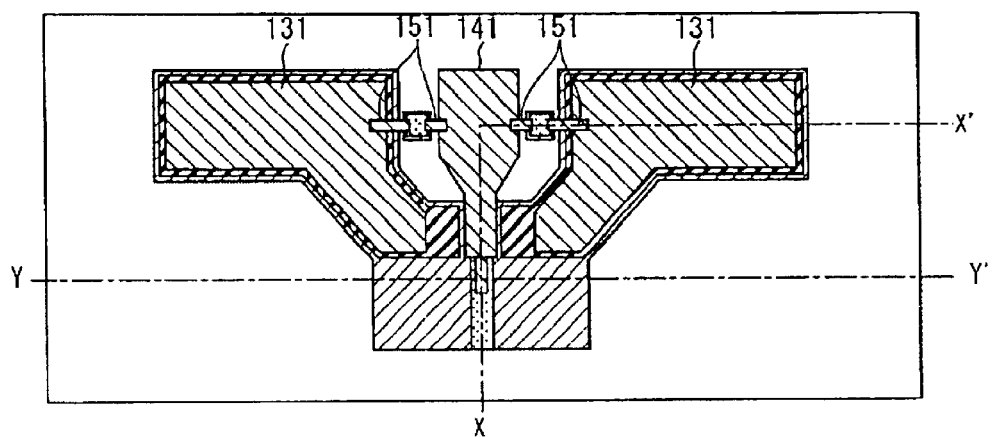
FIGS. 6(A) and 6(B) are a top view and a sectional view, respectively, of the workpiece of assistance in explaining an optical semiconductor device fabricating method in a second embodiment according to the present invention.
Figure 6B:
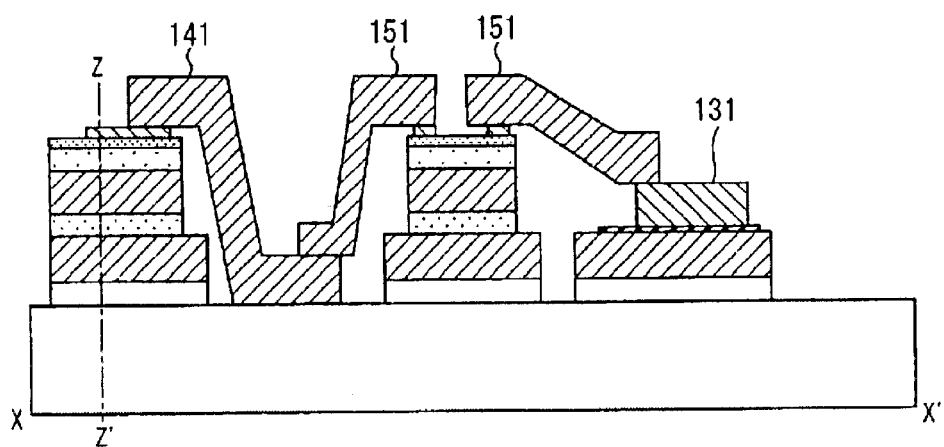

Referring to FIGS. 6(A) and 6(B), n-type wiring lines 131, i.e., first wiring lines, and a p-type wiring line 141, i.e., a second wiring line, are formed. The n-type wiring lines 131 are formed on the first contact metal layer 108 formed on the n-type InGaAsP core layer 103, and the p-type wiring line 141 is connected through the second contact metal layer 109 to the $p^{++}$-type $In_{0.53}Ga_{0.47}As$ contact layer 107. The p-type wiring line 141 extends toward the back of the InP substrate 101. The n-type wiring lines 131 are disposed on the opposite sides, respectively, of the p-type wiring line 141. The n-type wiring lines 131 and the $p^{++}$-type $In_{0.53}Ga_{0.47}As$ contact layers 107 of the resistors 121, the p-type wiring line 141 and the $p^{++}$-type $In_{0.53}Ga_{0.47}As$ contact layers 107 of the resistors 121 are connected by air bridges 151. Then, the InP substrate 101 is cleaved along a plane indicated by a straight line Y–Y' in FIG. 6(A) and a straight line Z–Z' in FIG. 6(B). A cleavage surface of the InP substrate 101 corresponding to the cleavage plane is coated entirely with an antireflection film of SiN, not shown.

The optical semiconductor device fabricating method in the second embodiment forms the photodiode and the resistors having the same depositing construction simultaneously by depositing the component layers and etching the component layers. Thus, any special processes for forming the resistors are unnecessary, and the optical semiconductor device in the first embodiment can be easily fabricated.

As apparent from the foregoing description, according to the present invention, the resistors are formed from the p-type semiconductor layer having a high resistivity, and hence the wiring lines do not need to be formed in a small width to provide a sufficient resistance. Consequently, the resistors can be formed accurately in a desired width to determine the resistance of the resistors accurately, which facilitates matching.

Experiments conducted by the inventors showed that the maximum sheet resistivity of the p-type semiconductor layer was on the order of $120\Omega/\square$, which is far greater than the sheet resistivity of $3\Omega/\square$ of the n-type semiconductor layer. It is known from the results of the experiments that the resistance of the resistor of the optical semiconductor device of the present invention is sufficiently high even if the resistance is formed in a width 10 times the width of the conventional resistor or greater.

What is claimed is:

1. An optical semiconductor device comprising:
    a photodiode formed by successively depositing a first-conduction-type layer, an active layer and a second-conduction-type layer in that order in a layered structure;
    resistors having a p-type semiconductor layer;
    first wiring lines; and
    a second wiring line;
    wherein the first wiring lines are electrically connected to the first-conduction-type layer, the second wiring line is electrically connected to the second-conduction-type layer, and the first-conduction-type and the second-conduction-type layer are connected electrically by the p-type semiconductor layer.

2. The optical semiconductor device according to claim 1, wherein the first-conduction-type layer is formed by successively layering an n-type cladding layer and an n-type core layer, the second-conduction-type layer is formed by successively layering a p-type core layer, a p-type cladding layer and a p-type contact layer, and the active layer is sandwiched between the n-type core layer and the p-type core layer.

3. The optical semiconductor device according to claim 1, wherein the first wiring lines and the second wiring line are connected to the p-type semiconductor layer of the resistors by air bridges.

4. The optical semiconductor device according to claim 1, wherein the first wiring lines and the second wiring line are connected to the p-type semiconductor layer by a plurality of air bridges.

5. The optical semiconductor device according to claim 1, wherein the photodiode and the resistors are formed on a semiconductor substrate, length of each air bridge is a dimension measured in a direction from the resistor toward the first and the second wiring lines, thickness of each air bridge is a dimension measured along a direction perpendicular to the semiconductor substrate, width of each air bridge is a dimension measured in a direction perpendicular to the length and the thickness, and each air bridge has a thickness of 5 $\mu$m or above in width.

6. The optical semiconductor device according to claim 1, wherein the photodiode and the resistors are formed on a semiconductor substrate, thickness of each air bridge is a dimension measured along a direction perpendicular to the semiconductor substrate, and the thickness of each air bridge is 1 $\mu$m or above.

7. The optical semiconductor device according to claim 1, wherein the photodiode and the resistors are formed on a semiconductor substrate, length of each air bridge is a dimension measured in a direction from the resistor toward the first and the second wiring lines, height of the resistors is a dimension measured in a direction perpendicular to the semiconductor substrate, and the length of each air bridge is twice the height of the resistors or above.

8. The optical semiconductor device according to claim 1, wherein the plurality of resistors are disposed axisymmetrically with respect to the second wiring line.

9. The optical semiconductor device according to claim 1, wherein the p-type layers of the plurality of resistors are electrically connected in series.

10. The optical semiconductor device according to claim 1, wherein the plurality of first wiring lines are extended axisymmetrically with respect to the second wiring line.

11. The optical semiconductor device according to claim 1, wherein the first wiring lines and the second wiring line are formed of a metal, and the first wiring lines are formed on the first-conduction-type layer.

12. The optical semiconductor device according to claim 11, wherein the first wiring lines are formed on a first contact metal layer formed on the first-conduction-type layer.

13. The optical semiconductor device according to claim 12, wherein the first-conduction-type layer is of an n-type, and the first contact metal layer is formed by successively layering an AuGe layer, an Ni layer and an Au layer.

14. The optical semiconductor device according to claim 11, wherein the second-conduction-type layer is of a p-type, and the second wiring line is connected through a second contact metal layer to the second-conduction-type layer.

15. The optical semiconductor device according to claim 14, wherein the first-conduction-type layer is of a p-type, and the second contact metal layer is formed by successively layering a Ti layer, a Pt layer and an Au layer or by successively layering an AuZn layer and an Au layer.

* * * * *